United States Patent
Böni et al.

(10) Patent No.: US 9,176,576 B2
(45) Date of Patent: Nov. 3, 2015

(54) INPUT DEVICE

(75) Inventors: Dominic Böni, Dielsdorf (CH); Robert Rupprecht, Esslingen (CH); Andrea Wüest, Zurich (CH); Pascal Gerner, Zurich (CH)

(73) Assignee: Sensirion AG, Stafa (CH)

( * ) Notice: Subject to any disclaimer, the term of this patent is extended or adjusted under 35 U.S.C. 154(b) by 201 days.

(21) Appl. No.: 13/979,774

(22) PCT Filed: Dec. 29, 2011

(86) PCT No.: PCT/CH2011/000311
§ 371 (c)(1),
(2), (4) Date: Sep. 30, 2013

(87) PCT Pub. No.: WO2012/097459
PCT Pub. Date: Jul. 26, 2012

(65) Prior Publication Data
US 2014/0055346 A1 Feb. 27, 2014

(30) Foreign Application Priority Data

Jan. 19, 2011 (EP) .................................. 11000373

(51) Int. Cl.
*G09G 5/00* (2006.01)
*G06F 3/01* (2006.01)
*H03K 17/94* (2006.01)

(52) U.S. Cl.
CPC . *G06F 3/01* (2013.01); *H03K 17/94* (2013.01)

(58) Field of Classification Search
CPC ....... H04W 4/008; G06F 1/1626; G06K 9/22; H04M 2250/12
USPC .................................................. 345/156–184
See application file for complete search history.

(56) References Cited

U.S. PATENT DOCUMENTS

| | | | |
|---|---|---|---|
| 7,519,748 B2 * | 4/2009 | Kuzmin | 710/67 |
| 8,650,345 B2 * | 2/2014 | Ranta et al. | 710/73 |
| 2007/0186923 A1 * | 8/2007 | Poutiatine et al. | 128/200.14 |
| 2008/0177404 A1 | 7/2008 | Bonnat | |
| 2009/0215439 A1 | 8/2009 | Hamilton et al. | |

(Continued)

FOREIGN PATENT DOCUMENTS

| | | |
|---|---|---|
| DE | 3817504 | 5/1987 |
| GB | 2177216 | 1/1997 |
| JP | 8125726 | 5/1996 |
| WO | 2005082294 | 9/2005 |

OTHER PUBLICATIONS

PCT International Search Report in connection with PCT/CH2011/000311, completed on Mar. 22, 2012 and mailed Apr. 10, 2012.

(Continued)

*Primary Examiner* — Abbas Abdulselam
*Assistant Examiner* — Gerald Oliver
(74) *Attorney, Agent, or Firm* — Cooper & Dunham LLP

(57) ABSTRACT

An input device for triggering a function of an electronic device comprises a humidity sensor (12), and a control unit (11). The control unit (11) analyzes a humidity signal (RH) supplied by the humidity sensor (12) and provides a trigger signal (C) subject to the analysis of the humidity signal (RH) for triggering the function of the electronic device (3). In such way, the function of the electronic device can simply be controlled by blowing at the input device (1).

11 Claims, 4 Drawing Sheets

(56) References Cited

U.S. PATENT DOCUMENTS

2010/0015992 A1   1/2010  Wakefield
2011/0066809 A1*  3/2011  Kinoshita .................... 711/118

OTHER PUBLICATIONS

PCT International Search Report in connection with PCT/CH2O11/000312, completed on Mar. 15, 2012 and mailed Mar. 21, 2012.

* cited by examiner

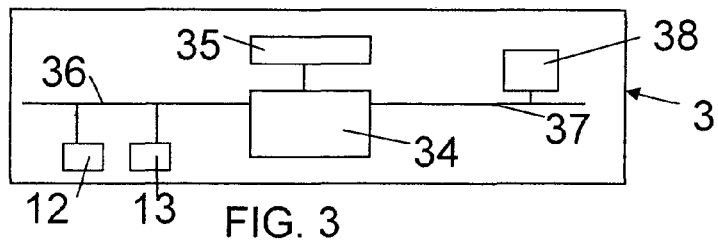
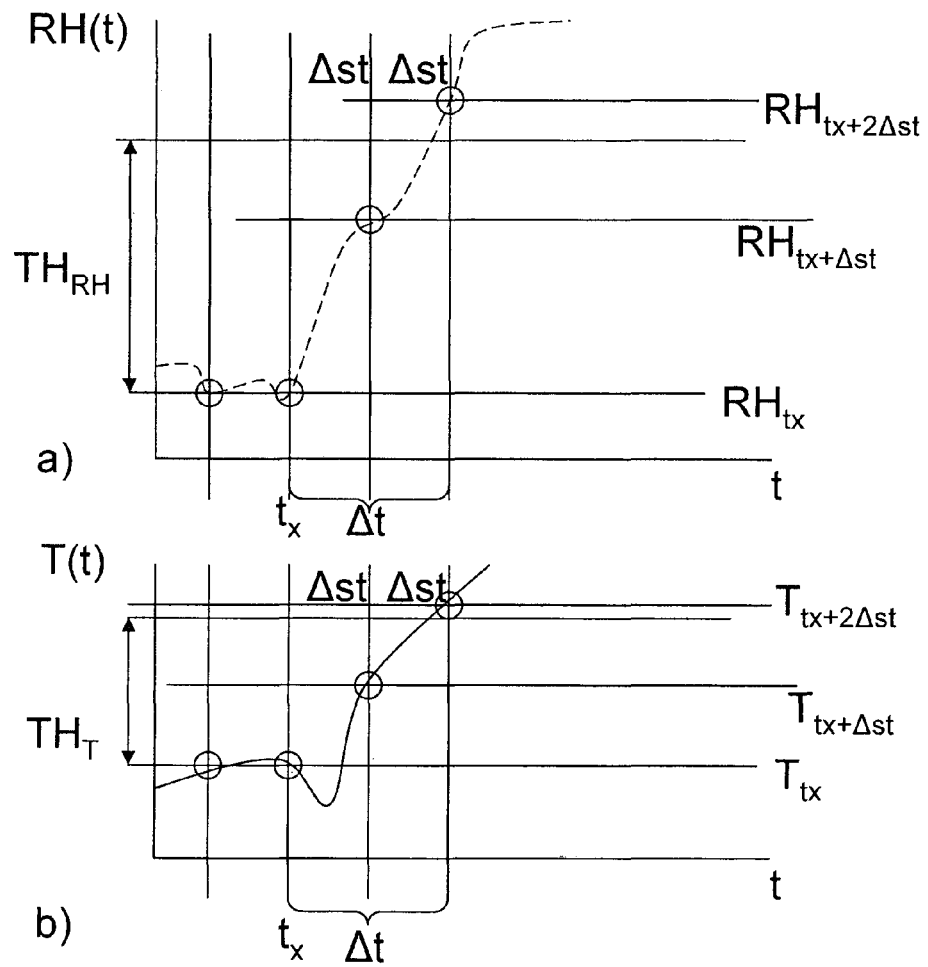
FIG. 4

INPUT DEVICE

CROSS REFERENCES TO RELATED APPLICATIONS

This application is a §371 national stage of PCT International Application No. PCT/CH2011/000311, filed Dec. 29, 2011, claiming priority of European Patent Application 11000373.8 filed Jan. 19, 2011, the entire contents of each of which are hereby incorporated by reference into this application in its entirety.

TECHNICAL FIELD

The present invention relates to an input device for triggering a function of an electronic device, a method for triggering a function of an electronic device, and a corresponding computer program element.

BACKGROUND ART

Miniaturization and wireless technologies have enabled portable electronic devices to process information in a ubiquitous way.

The more functions and features are integrated into smart phones, for example, the more interaction with the user can be expected. Today's human-machine interface of electronic devices still is strongly relying on key or touch key interaction. However, in many situations such interaction may be difficult since one hand of the user has to hold the device while the other hand may not be free either to interact with the device. Hence, there is a continuous interest to simplify and extend the ways of interacting with electronic devices.

DISCLOSURE OF THE INVENTION

The problem to be solved by the present invention is therefore to provide a simple and reliable keyless human-machine interface.

This problem is solved by an input device for triggering a function of an electronic device according to the features of claim 1. The input device comprises a humidity sensor and a control unit for analyzing a humidity signal supplied by the humidity sensor and for providing a trigger signal subject to the analysis of the humidity signal for triggering the function of the electronic device.

In this respect, a touch less way of interaction is proposed which enables the user of an electronic device to trigger functions without using the hands. A bare blow of the user directed towards the input device may be detected and serve as a trigger for controlling a function of the electronic device. In a preferred embodiment, the input device is integrated into the electronic device, such as a mobile phone, a handheld, a touchpad, a laptop, without limitation to such devices. Such class of electronic devices is characterized by being portable and including functions to be initiated/triggered by a user. Other classes of electronic devices which may benefit from such input device may include stationary devices such as flat panel displays, television sets, audio and video recorders, game consoles, etc. The input device may be integrated into such electronic devices, too. In another scenario, the input device may be separate from the electronic device and communicate to the electronic device in a wire less manner, such as, for example, by means of Bluetooth, or any other near range wireless transmission protocol. In a different scenario, it is only the humidity sensor that may be separated from the electronic device to be portable by the user while the control unit of the input device is arranged at the electronic device and may be integrated into the processing unit of the electronic device. Examples may be electronic pointing devices or game controllers.

The input device exploits an exhalation air stream of human beings as trigger to control a function. The exhalation air stream is detected by a humidity sensor converting the humidity inherent in the exhalation air stream into an electrical signal representing the humidity which in the following is denoted as humidity signal. In a preferred embodiment, the humidity sensor den livers a humidity signal representing the relative humidity. The relative humidity is defined by the absolute humidity divided by the maximum humidity the air may accept. Generally, the relative humidity of exhaled air is close to a 100% such that the exhaled air may properly be discriminated from other events causing a change in relative humidity. In the present context, the term humidity may always include the relative humidity. The humidity signal may be subject to treatment prior to being supplied to the control unit or prior to being analyzed in the control unit. Such treatment may include one or more of filtering, amplifying, compensating for undesired effects, dynamically compensating, building of any derivative, without limitation. Still, and irrespective of such treatment, the signal supplied to the control unit or the signal being analyzed there is considered as a humidity signal. In another embodiment, any such signal treatment may be considered as part of the analysis when executed in the control unit.

The humidity sensor preferably is a sensor of the kind that detects water molecules present in the air around the humidity sensor. In a preferred embodiment, the humidity sensor comprises a layer made from ceramics or a polymer. Such material may allow water molecules to enter the layer which results in a modified capacitance to be detected by electrodes used to determine the capacitance of the layer.

The interaction with an electronic device can be facilitated by the present input device in that a user simply needs to blow at the input device for triggering one or more functions of the electronic device. This represents a handy simplification in many real life situations in which the user may not have a hand free for typing or any other manual interaction with the electronic device. The present input device may be one of many input devices provided for controlling the functions to of the electronic device. Subject to the situation, the user may choose which input device is best to use. In a preferred embodiment, the input device as such may be enabled or disabled for usage. This may be achieved in a system set-up of the electronic device.

Such touch less interaction may optimize the use of existing functions in the electronic device and may enable new ones. The trigger assigned inputs and/or commands are implemented/executed by means of blowing towards the humidity sensor. The trigger signal may be assigned to functions such as taking a call on a mobile phone, turning pages of an electronic book, or scrolling through a picture gallery. Other functions to be triggered by the exhalation air stream may be one or more of denying a call, confirming or denying an operation, releasing a photo to be taken, switching on or off a function, opening or closing an application, opening or closing a window or menu on a screen, without limitation to the functions listed. Finally, any input and/or command can be assigned to the trigger signal that may be released by blowing at the present input device.

In a preferred embodiment, rather than analyzing the pure humidity levels in the corresponding signal, the dynamics of the humidity signal over time is exploited. The reason for doing so is that by blowing at the input device the humidity changes rapidly such that a rapid increase in the humidity signal may be observed and used as a means for distinguishing from a slow increase of the humidity as may be evoked by any other environmental event. In this respect, it is preferred to analyze the characteristics of the humidity signal over time, i.e. its dynamics, and make use of such dynamics alone, or in combination with the humidity level.

In a very preferred embodiment, the control unit is adapted for providing the trigger signal subject to a change of the humidity signal within a time interval. Such time interval may be the time between two sensor values being supplied by the humidity sensor, or be, for example, a multiple of such supply time. In particular, triggering the function may depend on—alone or in combination with other requirements to be fulfilled—the increase of the humidity signal exceeding an assigned threshold within the time interval. By suitably selecting the assigned threshold, the event of blowing at the humidity sensor can be distinguished from other events resulting in a change in humidity. In a preferred embodiment, a value of the threshold applied may be set subject to one or more previously measured values of the humidity signal. Such previously measured humidity values may represent, for example, the relative humidity in ambient air. This approach may take into account, that a blow at the humidity sensor at a low humidity may generate an increase in the sensed humidity that by far exceeds an increase in humidity caused by a blow at the input device at a higher humidity of the ambient air. In this context, it may be preferred that the threshold rises with falling humidity values of the ambient air.

In case such increase in humidity reaches or exceeds the assigned threshold within the time interval, the trigger signal may directly be generated, or the trigger signal at least may be enabled and may then depend on the fulfillment of any additional requirements.

Any additional requirement for triggering a function may be based on an analysis of the characteristics of a sensor signal from a sensor other than a humidity sensor which other sensor is responsive to an exhalation air stream, too. Then, the control unit preferably is adapted for analyzing a sensor signal supplied by such other sensor and for providing the trigger signal subject to both the analysis of the humidity signal and the analysis of the sensor signal. In a first step, this does solely imply that both signals are analyzed in parallel irrespective if or if not each signal complies with associated triggering requirements. According to a first trigger strategy embodiment, the trigger signal is generated if an increase of the humidity signal exceeds a threshold within a time interval or if an increase of the sensor signal exceeds another threshold within a time interval. In such way, a triggering of the function is guaranteed even if one of the sensors is impaired, since the other sensor may supply a signal sufficient for triggering the function on its own. In another trigger strategy embodiment, the trigger signal is generated only if an increase of the humidity signal exceeds a threshold within a time interval and if an increase of the sensor signal exceeds another threshold within a time interval. In such way, a non-exhalation air stream event may even better be distinguished from an exhalation air stream event since based on two different physical measurands, such other sensor may or may not confirm the result of the humidity sensor. The additional sensor preferably is exposed to an anticipated exhalation air stream as is the humidity sensor for having applied the same conditions to both sensors. In case the input device or the electronic device includes a casing with an opening for exposing a sensitive element of the humidity sensor to an environment of the casing, it is preferred that the other sensor may be arranged close to the humidity sensor such that both sensor face the opening in order to be exposed to the outside of the casing. The opening may be an opening solely assigned to the humidity sensor and if applicable to the other sensor, or it may be an opening already existing in the electronic device, such as an opening for a microphone of a mobile phone.

For supporting a close arrangement of the humidity sensor and the other sensor, it is preferred that these sensors are arranged on a common substrate, and, in another preferred embodiment, on a common chip including circuitry for operating the sensors and/or analyzing the humidity signal and the sensor signal.

Preferably, the other sensor may be embodied as one of a temperature sensor, an airflow sensor, and a pressure sensor, and especially as a differential pressure sensor or a microphone. The temperature sensor may detect a change in temperature caused by an exhalation air stream which for a human constantly is about 35° Celsius. In a signal of an airflow sensor, for example realized by means of a heater arranged in between two thermo-elements measuring the difference of heat upstream and downstream the heater allowing for referring to the flow of the gas, an increase of the airflow may indicate an exhalation air stream. In a signal of a pressure sensor, an increase of the pressure may indicate an exhalation air stream. One or more of such sensors may be added to the humidity sensor for detecting an exhalation air stream used for controlling a function of the electronic device.

Preferably, the dynamics in the sensor signal supplied by such other sensor such as a temperature sensor may be investigated, which dynamics are represented by the characteristics of the sensor signal over time. Preferably, the control unit is adapted for providing the trigger signal subject to a change of the sensor signal within the same time interval, and in particular subject to an increase of the sensor signal exceeding another threshold within the same time interval. For the reason, that the measurand measured by the other sensor is different to humidity, the thresholds applied represent different values. In another embodiment, the time intervals under consideration may be set to different values if needed.

According to another aspect of the present invention, a method is provided for triggering a function of an electronic device. In a first step a humidity signal supplied by a humidity sensor is analyzed, and the function of the electronic device is triggered subject to the analysis of the humidity signal.

According to a further aspect of the present invention, a computer program element is provided.

Other advantageous embodiments are listed in the dependent claims as well as in the description below.

The described embodiments similarly pertain to the device, the method and the computer program element. Synergetic effects may arise from different combinations of the embodiments although they might not be described in detail.

BRIEF DESCRIPTION OF THE DRAWINGS

The embodiments defined above and further aspects, features and advantages of the present invention can also be derived from the examples of embodiments to be described hereinafter and are explained with reference to the drawings. In the drawings the figures illustrate in FIG. 1 a usage scenario with a mobile phone according to an embodiment of the present invention, FIG. 2 a block diagram of an input device according to an embodiment of the present invention, FIG. 3 a block diagram of a mobile phone according to an embodiment of the present invention, FIG. 4 signal characteristics for explaining an analysis method according to an embodiment of the present invention, FIG. 5 signal characteristics for explaining an analysis method according to another embodiment of the present invention, FIG. 6 a cross section of a part of a casing of an mobile phone according to an embodiment of the present invention, to FIG. 7 a block diagram of a distributed input device according to an embodiment of the present invention, and FIG. 8 signal characteristics for explaining an analysis method according to a further embodiment of the present invention.

MODES FOR CARRYING OUT THE INVENTION

Figure 1:
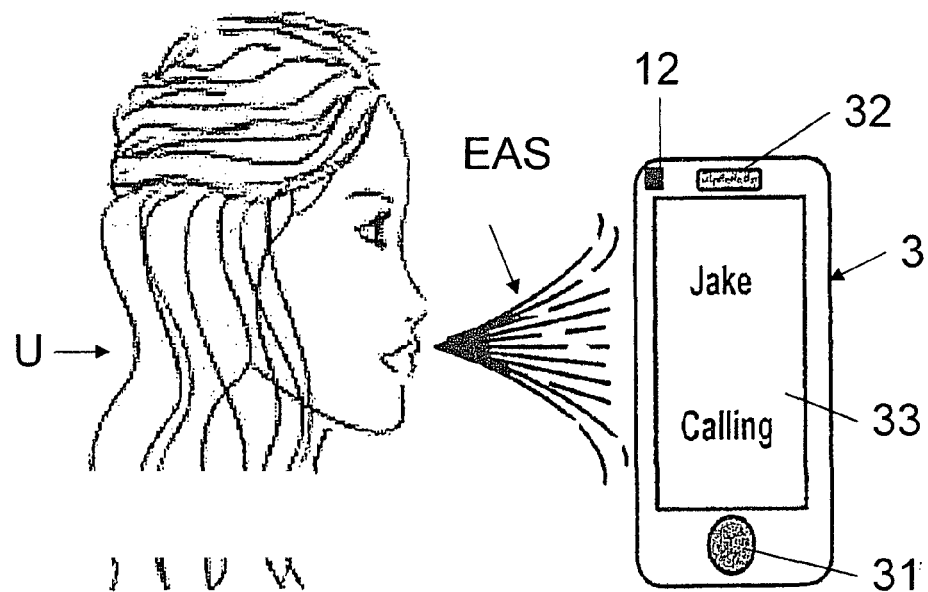

FIG. 1 illustrates a usage scenario with a mobile phone 3 according to an embodiment of the present invention. On a display 33 of the mobile phone 3 a message is displayed that Jake is calling. Apart from a standard microphone 31 as an input device a humidity sensor 12 is provided next to a standard speaker 32 of the mobile phone 3. A user U blows at the mobile phone 3 such that at least a part of an exhalation air stream EAS meets the humidity sensor 12. The humidity signal supplied by the humidity sensor 12 is analyzed by means of a logic, software or other means not shown. In case the analysis shows that the humidity signal can be interpreted as an exhalation air stream for intentionally controlling a function of the mobile phone 3, a trigger signal may be issued. In the present example, the function assigned to the trigger signal is to accept the incoming call. Summarizing, in the present example, the incoming call is accepted by the user U by blowing at the mobile phone 3, i.e. without interacting with keys or touch keys of the mobile phone 3. Hence, the user U may hold the mobile phone 3 in her one hand and may use her other hand freely without the need to press a key or a button for accepting the call.

Figure 2:
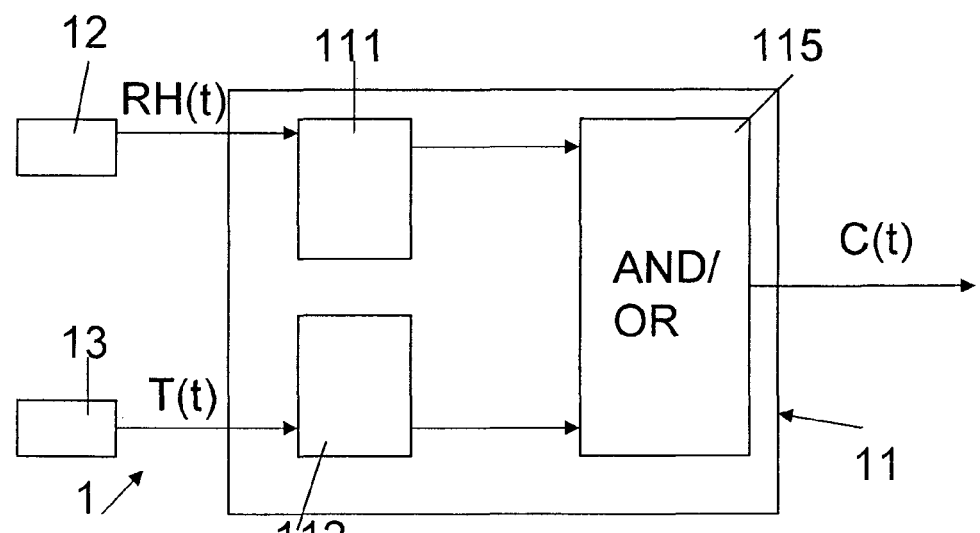

FIG. 2 illustrates a block diagram of an input device 1 according to an embodiment of the present invention. The input device 1 in the present embodiment includes another sensor 13 next to the humidity sensor 12, which other sensor 13 in the present example is a temperature sensor 13. The exhalation air stream of a human being is characterized by a nearly constant temperature of about 35° Celsius, and a nearly constant relative humidity of about a 100%. In general, the exhalation air stream is distinctly different in both temperature and humidity from typical environmental changes in temperature and humidity. As a result, exhaled air blown at a combination of a humidity sensor and a temperature sensor will simultaneously make the relative humidity signal RH(t) and the temperature signal T(t) rise significantly. Thus, blowing exhaled air towards such input device 1 includes both a rapid change of the relative humidity RH and a rapid change of the temperature T. Using a humidity sensor 12 and a temperature sensor 13 to track these changes allows to detect the correlated change and thus constitutes a proper means for triggering inputs and/or commands—collectively denoted as functions—on the electronic device.

Figure 6:
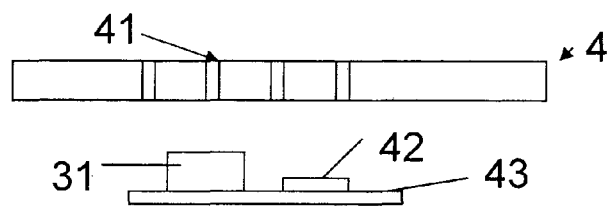

In a preferred embodiment, and as shown in the partial side cut of a lower part of a mobile phone 3 in FIG. 6, a substrate 42 is arranged next to a microphone 31 on a carrier 43 of the mobile phone 3, such as a flexible circuit board or a printed circuit board. The microphone 31 is arranged next to and below an opening 41 in a casing 4 of the mobile phone 3. The opening in the present example is represented by multiple bores in the casing 4. The substrate 42 carries the humidity sensor 12 and—if available—the temperature sensor 13 which presently are not shown. The substrate 42 is arranged such that the humidity sensor 12 and the temperature sensor 13 are sufficiently exposed to the opening 41 in order to receive an exhalation air stream directed at the opening 41.

The humidity signal RH(t) and the temperature signal T(t) are supplied by the respective sensors 12 and 13 to a control unit 11. The control unit 11 comprises an analyzing section including two analyzers 111 and 112 each one assigned to one of the received signals RH(t) and T(t) for analyzing these signals, and in particular for analyzing the characteristics of these signals RH(t), T(t) over time, i.e. their dynamics. In a preferred embodiment, it is a change in each of the signals RH(t), T(t) to be analyzed for the reason that the change of each of these signals RH(t), T(t) or their simultaneous change may be used for distinguishing between an environmental change of the measurands and an exhalation air stream induced change of the measurands.

Switching to FIG. 4a), a sample relative humidity characteristic RH(t) over time resulting from an exhalation air stream is depicted. The relative humidity values measured at discrete points in time are illustrated by circles and are supplied by the humidity sensor every $\Delta$st sec, with such supply time being $\Delta$st=500 ms, for example, are dynamically compensated, for example, and then are subjected to the analysis. Hence, a change in the humidity can be observed at a minimum for the supply time $\Delta$st. In a preferred embodiment, the time interval $\Delta$t is equal to or a multiple of the supply time $\Delta$st for which a change in the humidity signal RH(t) is determined and which change then may be compared to a threshold $TH_{RH}$. In a preferred embodiment, the time interval $\Delta t=\Delta st$, and in another preferred embodiment, the time interval $\Delta t=2\Delta st$. For each time interval $\Delta t$, a change in humidity RH during such time interval $\Delta t$ is determined and compared to the threshold $TH_{RH}$. In a preferred embodiment, the control unit 11 compares each humidity value RH supplied, e.g. at supply times $t=x*\Delta st$, with x being an integer, with a humidity value previously supplied. In a preferred embodiment, the present humidity value is compared to the humidity value of two supply times $\Delta$st ago, such that the time interval $\Delta$t for which the change in the humidity signal RH is determined is equal to $\Delta t=2*\Delta st$. For holding previous humidity values, a simple shift register may be provided for temporary storage. In the present diagram of FIG. 4a), it can be derived that this condition is fulfilled for the time interval staring at $t=t_x$. The change of the humidity signal RH in such interval $\Delta t$ is determined by $\Delta RH=RH_{tx+2\Delta st}-RH_{tx}$. Such change is positive and as such represents an increase, and exceeds the assigned threshold $TH_{RH}$. Provided that it is only a humidity sensor available, the analysis of the sample humidity signal RH may result in a trigger of the function by means of issuing the trigger signal C.

The analysis of the humidity signal RH(t) may alternatively include in a preferred embodiment an investigation of the change of the humidity signal RH(t) in more than one time interval $\Delta$t. For example, the trigger signal may only be generated, if an increase in the humidity signal RH(t) exceeds an assigned threshold $TH_{RH}$ in two consecutive time intervals $\Delta$t. In FIG. 4a) this may be illustrated for a time interval being set to $\Delta t=\Delta st$ in that a first change in humidity $\Delta RH=RH_{tx+\Delta st}-RH_{tx}$ for the time interval $\Delta t=\Delta st$ starting at $t=t_x$ exceeds a threshold $TH_{RH}$, and a second change in humidity $\Delta RH=RH_{tx+2\Delta st}-RH_{tx+\Delta t}$ in the subsequent time interval $\Delta t=\Delta st$ exceeds the threshold $TH_{RH}$, too, with the threshold $TH_{RH}$ taking a lower value to initiate a trigger signal than the one depicted in FIG. 4a).

In case there is a temperature sensor 13 provided in addition to the humidity sensor, a temperature signal T(t) supplied by the temperature sensor 13 may be analyzed by its corresponding analyzer 112 in a similar way: In FIG. 4b), a sample temperature characteristic T(t) is depicted in response to blowing at the temperature sensor 13 of FIG. 2. The temperature is measured at discrete points in time every Δst sec, with such supply time being Δst=500 ms, for example, and the associated values are subjected to the analysis. Hence, a change in the temperature required for at least enabling triggering can be observed for the time interval Δt=2 Δst starting at t=$t_x$. Hence, in a preferred embodiment, a trigger signal is generated or at least enabled if during the time interval Δt the increase in the temperature signal T(t) exceeds an assigned threshold $TH_T$. In the associated diagram of FIG. 4b), this condition is fulfilled for the time interval starting at t=$t_x$. The change of the temperature signal T in such time interval Δt is determined by $\Delta T = T_{tx+\Delta t} - T_{tx}$. Such increase exceeds the assigned threshold $TH_T$. The triggering enabling signal meets the triggering enabling signal issued by the analyzer 111 at the AND/OR gate 115. Subject to the gates implementation, the trigger signal C(t) is generated if both trigger enabling signals are provided by the analyzers 111 and 112—this is true for gate 115 being an AND gate—or the trigger signal C(t) may be generated even if only one of the trigger enabling signals from the analyzers 111 or 112 is provided—this is true for the gate 115 being an OR-gate.

Figure 5:
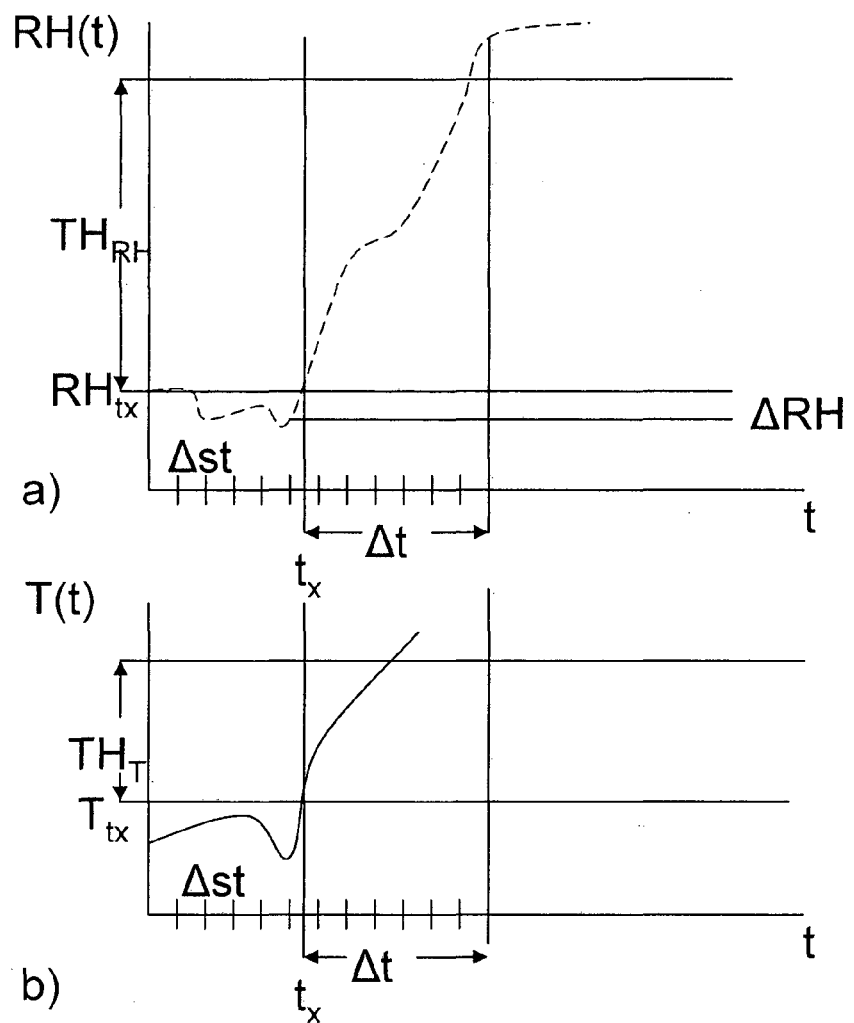

The diagrams of FIG. 5 show the same sample humidity and temperature signals RH and T, however, based on a slightly different analysis concept. It is assumed that the frequency 1/Δst at which the signal values RH an T are supplied is higher than in the example of FIG. 4. This means that the supply time Δst between two measurements is smaller than in FIG. 4 and as such a change in the signal in such time interval may be less significant for a blow at the input device. Hence, in a preferred embodiment, it is the present humidity value compared to the previous humidity value resulting in the determination of a change in humidity ΔRH over the supply time Δst. In case such comparison results in a humidity change ΔRH exceeding a starting humidity threshold $STH_{RH}$ then the present humidity value $RH_{tx}$ is taken as a reference humidity value for the analysis. In the present example shown in FIG. 5a), such condition is fulfilled at sample point $t_x$ with $\Delta RH = RH_{tx} - RH_{tx-\Delta st}$. It will be monitored in the following if the humidity signal RH(t) will rise more than a threshold $TH_{RH}$ with respect to the reference humidity value $RH_{tx}$ within a given time interval Δt starting from the point in time t, at which the starting condition was fulfilled, given time interval Δt encompassing several supply times Δst times, such that Δt=m*Δst, m being an integer.

In the example of FIG. 5a) this requirement is fulfilled for the humidity signal RH(t). In the present example, once the humidity signal RH matches the starting requirement $\Delta RH > STH_{RH}$ for starting an analysis of the change of the humidity over the given time interval Δt, an analysis of a change of the temperature over the same interval Δt is started, too. Hence, at point in time $t_x$ the temperature value $T(t_x)$ is determined as reference temperature $T_x$. For each subsequent point in time a sensor value is supplied in the interval $t_x + \Delta st$ it is verified if a change in temperature $\Delta T = T(t) - T_x$ exceeds a temperature threshold $TH_T$, similar to the above verification if a change in humidity $\Delta RH = RH(t) - RH_x$ exceeds a humidity threshold $TH_{RH}$. In other words, the temperature signal T(t) needs to rise more than another threshold $TH_T$ within a the same given time interval Δt starting from the sample point $t_x$ in order to generate its corresponding trigger enabling signal.

In an alternate embodiment, it is only the temperature signal enabling a start of the analysis of both the humidity signal and the temperature signal. In another embodiment, each signal RH(t) and T(t) may be verified for a starting condition and trigger the start of the analysis within the assigned time intervals respectively. This may result in different starting points $t_x$ for the humidity signal RH(t) and $t_y$ for the temperature signal T(t). For each signal, the associated trigger requirement may be verified and confirmed, which may be achieved for the humidity signal RH(t) at a point in time $t_m$ and for the temperature signal T(t) at point in time $t_n$. In case the gate 115 is an AND gate, the trigger signal C may only be generated once a trigger enabling signal from the humidity analyzer 111 overlaps in time with a trigger enabling signal from the temperature analyzer 112, i.e. if the trigger enabling signals are generated with a given time window.

For the above embodiment including a starting condition not necessarily each signal value RH, or T generated every Δst seconds may need to be compared to an assigned threshold. Instead, it may be waited until the end of the given time interval Δt, and the signal value at such point in time may be compared to the one at the starting point of the time interval Δt. A difference of these two values may be accepted as a measure for a change of the signal within the given time interval Δt which change may be compared to the assigned threshold.

In the block diagram of FIG. 2, the analyzers 111 and 112, and possibly other building blocks are solely depicted as individual blocks for explaining the functional processing in the control unit 11. Some or all of these building blocks may also be embodied as software and run on a single microprocessor. Such embodiment is illustrated in FIG. 3 which shows a schematic hardware oriented block diagram of a mobile phone 3. Here, the processing as illustrated in connection with FIG. 2 is implemented as software residing in a memory 38 connected to a microprocessor 34 via a system bus 37, and will be executed by the microprocessor 34 on demand. The humidity sensor 12 and the temperature sensor 13 are connected to the microprocessor 34 via an input system bus 36. In addition, there is shown a wireless interface 35 of the mobile phone 3.

Figure 7:
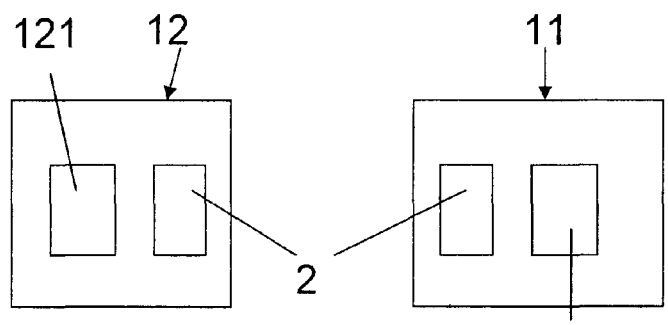

In the above embodiment of a mobile phone 3, the one or more sensors for detecting an exhalation of a user are arranged in the electronic device together with the control unit 11 which control unit 11 may be merged with the overall control unit of such electronic device. In a different embodiment according to FIG. 7, the humidity sensor 12 and possibly any other sensors used may be separate from the control unit 11. On behalf of the humidity sensor 12, a sensitive element 121 is depicted, and a wireless transmitter 2 is included in such humidity sensor 12 for sending the humidity signal to a wireless transmitter 2 of the control unit 11 which control unit 11 comprises a microprocessor 34 for analyzing the humidity signal. This block diagram is rather of schematic nature in that all the various embodiments described above may also be implemented in such distributed input device. For example, a temperature sensor may be arranged together with the humidity sensor 12 and may use the common wireless transmitter 2 communicating to the remote control unit 11. The control unit 11 may be part of a mobile or a stationary computing or telecommunication device.

Further optimization may be achieved by using settable thresholds $TH_{RH}$ and/or $TH_T$ depending on absolute previous measurement values $RH_x$ and/or $T_x$ respectively. The thresholds $TH_{RH}$ and/or $TH_T$ as trigger levels may be chosen according to the requirements of the function that should be triggered. For example, to trigger the shutter of a camera in a mobile phone, one might prefer a very sensitive trigger while when accepting a call the trigger level may be chosen in a way that the user has to clearly exhale onto the electronic device on purpose. This of course holds, also when there is only the humidity sensor provided without the presence of a temperature sensor.

From the diagrams in FIGS. 4a) and b) it can be derived that the thresholds and the time intervals are set such that it can be expected that an exhalation air stream would result in humidity and temperature signals that reach the associated thresholds within the assigned given time intervals. On the other hand, it would be expected that changes in humidity and/or temperature evoked by different events such as pure environmental changes or, for example, changes resulting from putting the electronic device into a pocket would show slower slopes and not reach the assigned thresholds within the given time intervals. Moreover, there are many scenarios of non-exhalation events which only may result in a change of one of the two signals. In this respect, the additional sensor, which in the present case is the temperature sensor, may act as a safety sensor for preventing a wrong interpretation of a scenario in which only the humidity signal rises swiftly. The same holds, of course the other way round in that the humidity sensor acts as a safety sensor for the temperature sensor.

In another preferred embodiment, the function assigned to the trigger signal C may vary subject to the characteristic of the humidity signal RH. In case a first blowing pattern may be identified in the humidity signal RH, a first function may be assigned to the trigger signal C, i.e. in other words the trigger signal C executes a first function. In case a second blowing pattern may be identified in the humidity signal RH, a second function may be assigned to the trigger signal C, i.e. in other words the trigger signal C executes a second function different from the first function. As an example, the first blowing pattern may be a single blow event, preferably within a given time window to be monitored, and the second blowing pattern may be a double blow event comprising two subsequent blows with a short break in between, preferably within a given time window to be monitored. Once the control unit 11 identifies the first blowing pattern, the assigned function may be, for example, to page up in an application, and once the control unit 11 identifies the second blowing pattern, the assigned function may be, for example, to page down in such application.

Specifically, a first function may be assigned to the trigger signal C out of a set of functions if an increase of the humidity signal RH exceeds a threshold $TH_{RH}$ within a time interval $\Delta t$ and if after a decrease following the increase no new increase is monitored in the humidity signal RH within a given time window. A second function may be assigned to the trigger signal C out of the set of functions if an increase of the humidity signal RH exceeds a threshold $TH_{RH}$ within a time interval $\Delta t$ and if after a decrease following the increase a new increase is monitored in the humidity signal RH within a given time window.

Figure 8:
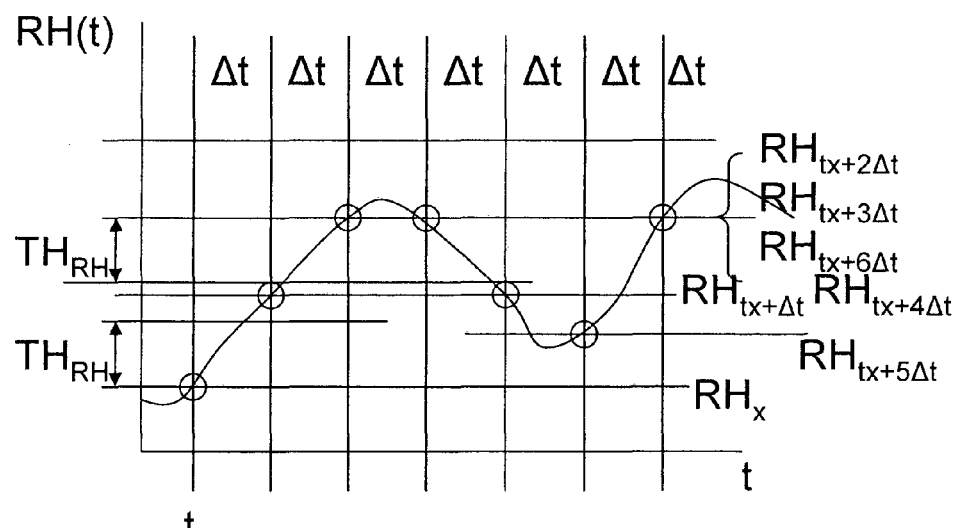

A sample humidity signal RH(t) representing a double blow pattern is illustrated in the diagram of FIG. 8 over time t. Starting at time $t_x$, for the following time interval $\Delta t = \Delta st$ an assigned threshold $TH_{RH}$ is exceeded by the respective increase in the humidity signal RH(t) such that a blow at the input device 1 is identified. However, in such embodiment, the trigger signal C is not issued immediately in response to the identification of such single blow pattern since the humidity signal RH(t) will continued to be analyzed during the subsequent time intervals $\Delta t$. Starting after $t=t_x+2\Delta t$ the humidity signal RH(t) peaks and then starts to drop again. It is identified that during the time interval starting at $t=t_x+3\Delta t$ the humidity signal RH(t) makes a significant negative change, i.e. the humidity signal RH(t) drops and such drop exceeds the threshold $TH_{RH}$. During the interval starting at $t=t_x+5\Delta t$, the humidity signal RH(t) rises again and shows a significant positive change again exceeding the threshold $TH_{RH}$.

As a result, within a given time window $\Delta tw$ of, for example, $\Delta tw=10\Delta t$, a double peak may be identified in the humidity signal RH(t). The identification of a double peak may be translated into identifying a first peak by means of an increase of the humidity exceeding a threshold, followed by a drop of the humidity exceeding the same or another threshold, and by another increase of the humidity following the drop such increase exceeding the same or another threshold again. Each of the three events—increase—drop—increase—may be applied to the time interval $\Delta t$, and all three events may preferably need to occur within the time window $\Delta tw$. In case a blowing pattern representing a double blow is identified within the time window $\Delta tw$, a function is assigned to the trigger signal C to be generated which function is different to the function assigned to the trigger signal C when a different blow pattern is identified, such as for example a single blow without another increase in the time window after a drop following the first increase.

In other embodiments, the present input device may be extended by additional sensors for detecting the strength of blow, the direction, or very fast multi-trigger events, input opportunities may be increased various various input events may be distinguished from each other by means of suitable algorithms used in analyzing the various sensor signals.

While there are shown and described presently preferred embodiments of the invention, it is to be distinctly understood that the invention is not limited thereto but may be otherwise variously embodied and practiced within the scope of the following claims.

The invention claimed is:

1. Input device for triggering a function of an electronic device, comprising
    a humidity sensor, and
    a control unit for analyzing a humidity signal supplied by the humidity sensor and for providing a trigger signal subject to the analysis of the humidity signal for triggering the function of the electronic device,
    wherein the control unit is adapted for assigning the function to the trigger signal out of a set of functions subject to a characteristic of the humidity signal over time,
    wherein the control unit is adapted for assigning a first function to the trigger signal out of a set of functions if an increase of the humidity signal exceeds a threshold within a time interval and if after a decrease following the increase no new increase is monitored in the humidity signal within a given time window, and
    wherein the control unit is adapted for assigning a second function to the trigger signal out of the set of functions if an increase of the humidity signal exceeds a threshold within a time interval and if after a decrease following the increase a new increase is monitored in the humidity signal within the given time window.

2. Input device according to claim 1, wherein the humidity sensor is provided for receiving an exhalation air flow of a user.

3. Input device according to claim 1,
    comprising another sensor responsive to an exhalation air flow which other sensor is different from a humidity sensor, and
    wherein the control unit is adapted for analyzing a sensor signal supplied by the other sensor and for providing the trigger signal subject to both the analysis of the humidity signal and the analysis of the sensor signal.

4. Input device according to claim 3,
wherein the control unit is adapted for providing the trigger signal if one or more of an increase of the humidity signal exceeds a threshold within a time interval and an increase of the sensor signal exceeds another threshold within a time interval.

5. Input device according to claim 3,
wherein the control unit is adapted for setting a value of the threshold subject to one or more previously measured values of the humidity signal.

6. Input device according to claim 3,
wherein the other sensor is one of:
   a temperature sensor,
   an airflow sensor, and
   a pressure sensor.

7. Input device according to claim 1,
comprising a casing with an opening for exposing a sensitive element of the humidity sensor to an environment of the casing.

8. Input device according to claim 1,
wherein the humidity sensor is arranged separate from the control unit, and
wherein a wireless link is provided for enabling the humidity sensor to transmit the humidity signal to the control unit.

9. Input device according to claim 1,
wherein the control unit is adapted for providing a trigger signal for triggering one or more of:
   accepting or denying a call,
   a page up or page down operation,
   confirming or denying an operation,
   releasing a photo to be taken,
   switching on or off a function,
   opening or closing an application,
   opening or closing a window on a screen,
   opening or closing a menu on a screen.

10. Electronic device, comprising an input device according to claim 1,
wherein the electronic device is one of:
   a mobile phone,
   a handheld computer,
   an electronic reader,
   a tablet computer,
   a game controller,
   a pointing device,
   a photo or video camera,
   a computer peripheral.

11. Input device according to claim 1,
wherein the control unit is adapted for providing the trigger signal subject to an increase of the humidity signal exceeding a threshold within a time interval.

* * * * *